(12) United States Patent
Van Houdt et al.

(10) Patent No.: US 10,211,223 B2
(45) Date of Patent: Feb. 19, 2019

(54) VERTICAL FERROELECTRIC MEMORY DEVICE AND A METHOD FOR MANUFACTURING THEREOF

(71) Applicant: IMEC VZW, Leuven (BE)

(72) Inventors: Jan Van Houdt, Bekkevoort (BE); Pieter Blomme, Leuven (BE)

(73) Assignee: IMEC vzw, Leuven (BE)

( * ) Notice: Subject to any disclaimer, the term of this patent is extended or adjusted under 35 U.S.C. 154(b) by 53 days.

(21) Appl. No.: 14/998,227

(22) Filed: Dec. 23, 2015

(65) Prior Publication Data
US 2016/0181259 A1    Jun. 23, 2016

(51) Int. Cl.
| | |
|---|---|
| *G11C 11/22* | (2006.01) |
| *H01L 21/28* | (2006.01) |
| *H01L 29/51* | (2006.01) |
| *H01L 29/66* | (2006.01) |
| *H01L 29/78* | (2006.01) |
| *H01L 27/1159* | (2017.01) |
| *H01L 27/11597* | (2017.01) |

(52) U.S. Cl.
CPC ...... *H01L 27/1159* (2013.01); *G11C 11/2273* (2013.01); *H01L 21/28291* (2013.01); *H01L 27/11597* (2013.01); *H01L 29/516* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| | | | |
|---|---|---|---|
| 2011/0018047 A1* | 1/2011 | Komiya | H01L 27/11521 257/315 |
| 2011/0188288 A1* | 8/2011 | Minami | G11C 11/22 365/145 |
| 2014/0070289 A1* | 3/2014 | Tanaka | H01L 21/28291 257/295 |
| 2014/0070290 A1 | 3/2014 | Inumiya et al. | |
| 2014/0340952 A1* | 11/2014 | Ramaswamy | G11C 11/221 365/51 |

(Continued)

OTHER PUBLICATIONS

European Search Report dated Jun. 26, 2015 in European Patent Application No. 14199937.5.

(Continued)

*Primary Examiner* — David E Graybill
(74) *Attorney, Agent, or Firm* — Knobbe, Martens, Olson & Bear LLP

(57) ABSTRACT

The disclosed technology generally relates to semiconductor devices, and more particularly to a ferroelectric memory device and a method of manufacturing and using the same. In one aspect, a vertical ferroelectric memory device includes a stack of horizontal layers formed on a semiconductor substrate, where the stack of layers includes a plurality gate electrode layers alternating with a plurality of insulating layers. A vertical structure extends vertically through the stack of horizontal layers, where the vertical structure has a vertical channel structure and a sidewall having formed thereon a vertical transition metal oxide (TMO) ferroelectric layer. A memory cell is formed at each of overlapping regions between the gate electrode layers and the vertical channel structure.

12 Claims, 12 Drawing Sheets

(56) References Cited

U.S. PATENT DOCUMENTS

| | | | | |
|---|---|---|---|---|
| 2015/0041873 A1* | 2/2015 | Karda | ............... | H01L 21/28291 |
| | | | | 257/295 |
| 2016/0042802 A1* | 2/2016 | Mui | .................. | G11C 16/3459 |
| | | | | 365/185.22 |
| 2016/0064531 A1* | 3/2016 | Xiao | ................ | H01L 29/66818 |
| | | | | 257/9 |
| 2016/0163731 A1* | 6/2016 | Tan | ..................... | H01L 29/0638 |
| | | | | 257/324 |

OTHER PUBLICATIONS

Ma et al., "Why is Nonvolatile Ferroelectric Memory Field-Effect Transistor Still Elusive?" 2002 IEEE Electron Device Letters, vol. 23(7), pp. 386-388.

Müller et al., "Ferroelectric Hafnium Oxide: A CMOS-compatible and highly scalable approach to future ferroelectric memories," 2013, IEEE 10.8.1-10.8.4.

Müller et al.., "Ferroelectricity in Hafnium Oxide: CMOS compatible Ferroelectric Field Effect Transistors," 2011, IEEE 24.5.1-24.5.4.

Setter et al., "Ferroelectric thin films: Review of materials, properties, and applications," 2006, Journal of Applied Physics 100, 051606-1-46.

* cited by examiner

VERTICAL FERROELECTRIC MEMORY DEVICE AND A METHOD FOR MANUFACTURING THEREOF

CROSS-REFERENCE TO RELATED APPLICATIONS

This application claims foreign priority to European application EP 14199937.5, filed Dec. 23, 2014, the content of which is incorporated by reference herein in its entirety.

BACKGROUND

Field

The disclosed technology generally relates to semiconductor devices, and more particularly to a ferroelectric memory device and a method of manufacturing and using the same.

Description of the Related Technology

Advances in semiconductor fabrication technology continue to enable physical scaling of semiconductor integrated circuit devices. One of the technological advances in new generations of semiconductor devices, e.g., memory device technologies at advanced technology nodes (e.g., nodes below 10 nm), includes three dimensional (3D) memory devices or vertical non-volatile memory devices, such as, for example, 3D NAND flash memory devices. However, some 3D NAND flash memory technologies can have a number of disadvantages, such as: limited scalability (scaling the plug diameter is difficult), a need for high voltages (typically higher than 10V, even higher than 15V) and/or electrical nonuniformities associated with tapering of the vertical channel resulting from vertically nonuniform etch profiles.

Another type of non-volatile memory device is the ferroelectric field effect transistor (FeFET) which can also be built in a vertical configuration. US patent application US2014/0070290 A1 discloses a ferroelectric memory having a 3D structure type NAND memory cell. The memory comprises cell gate electrodes and interlayer insulating films which are alternately stacked, and a trench which passes through this stack structure. A gate insulating film and an interfacial insulating film are stacked on the inner wall of the trench, and the core of the trench is filled with an n-type semiconductor layer. A cell gate region, an inter-adjacent-cell-gate region, and a select gate region are defined. The vertical gate insulating film is tuned to be ferroelectric in the cell gate region and insulating in the inter-adjacent-cell-gate region and the select gate region. The vertical gate insulating film includes a metal that is hafnium (Hf) or zirconium (Zr) and oxygen as the main components and to which an element selected from the group consisting of silicon (Si), magnesium (Mg), aluminum (Al), and yttrium (Y) is added. Along the inter-adjacent-cell-gate region additionally Nitrogen and Carbon elements are added which act as fixed charge impurities, thereby suppressing polarization in this region. As such any wrong memory operation can be avoided.

Regardless of whether the FeFETs are integarated as planar two-dimensional or vertical three-dimensional memory transistors, many technological challenges of FeFET memory devices continue to remain. For example, some FeFET memory devices have been known to suffer from limited data retention times (i.e., times associated with change in a polarization state without external power), whose effects have been associated with the presence of a depolarization field. The problem of retention loss and the depolarization field is for example also explained in an article of Ma T. P. et al. titled "Why is nonvolatile ferroelectric memory field-effect transistor still elusive?" from IEEE Electron Device Letters, Vol. 23(7) p. 386 (2002). Thus, there is a need for FeFET devices memory devices with improved data retention and scalability.

SUMMARY OF CERTAIN INVENTIVE ASPECTS

An object of the present disclosure is to provide a vertical (three-dimensional) ferroelectric memory device with improved scalability and improved device performance i.e. with improved retention times. Such a memory device further has a reduced depolarization field.

According to a first aspect of the present disclosure a vertical ferroelectric memory device is disclosed comprising a stack of horizontal layers on a semiconductor substrate having a major surface; the stack of layers comprising a repetitive sequence of a gate electrode layer on an insulating layer; a vertical structure extending through the stack of horizontal layers and substantially perpendicular to the major surface of the substrate, the vertical structure having a sidewall along the stack of horizontal layers; the vertical structure comprising along the sidewall a vertical transition metal oxide (TMO) ferroelectric layer; aside and along the vertical transition metal Oxide (TMO) ferroelectric layer a vertical highly doped junction-less channel layer, thereby forming at the overlap of a gate electrode layer with the channel layer a memory cell.

According to embodiments of the first inventive aspect, the vertical structure has one of a trench shape or a pillar shape.

According to embodiments of the first inventive aspect, the ratio of the extrinsic Debye length to the relative permittivity of the vertical channel layer is smaller than the ratio of the layer thickness of the vertical TMO ferroelectric layer to the relative permittivity of the vertical TMO ferroelectric layer.

According to embodiments of the first inventive aspect, the vertical channel layer comprises doped silicon having a dopant concentration higher than 1e18 dopants/$cm^3$.

According to embodiments of the first inventive aspect, the vertical structure further comprises a vertical interfacial insulating layer in between the vertical channel layer and the vertical TMO ferroelectric layer.

According to embodiments of the first inventive aspect, the vertical structure further comprises a region aside the vertical channel layer which region comprises a dielectric filler material.

According to embodiments of the first inventive aspect, the dielectric filler material comprises $SiO_2$, SiN, a low-k material or air thus forming an air gap.

According to embodiments of the first inventive aspect, the vertical TMO ferroelectric layer is a doped Hf-based ferroelectric layer.

According to embodiments of the first inventive aspect, the Hf-based vertical ferroelectric layer is doped with any of Al, Si, Y, Sr, La, Gd, Zr, or a combination thereof.

According to embodiments of the first inventive aspect, the horizontal gate electrode layer comprises a metal chosen from any of Cu, Al, Ti, W, Ni, Au, TiN, TaN, TaC, NbN, RuTa, Co, Ta, Mo, Pd, Pt, Ru, Ir and Ag or a combination thereof.

According to a second aspect of the present disclosure, a method for manufacturing a vertical ferroelectric memory device is disclosed, the method comprising the steps of providing a stack of horizontal layers on a semiconductor substrate having a major surface, the stack of horizontal layers comprising a repetitive sequence of a gate electrode layer on an insulating layer; providing through the stack of horizontal layers substantially perpendicular to the major surface of the semiconductor substrate a vertical opening thereby exposing the semiconductor substrate and exposing the sidewall of stack of horizontal layers; providing in the vertical opening along the sidewall of the exposed stack of horizontal layers a vertical transition metal oxide (TMO) ferroelectric layer, and; providing in the vertical opening aside and along the vertical transition metal oxide (TMO) ferroelectric layer a vertical highly doped junction-less channel layer.

According to embodiments of the second inventive aspect, after providing the vertical channel layer, a dielectric filling material is provided in the remaining part of the vertical opening thereby filling the vertical opening. The dielectric filler material comprises preferably SiO2, SiN, a low-k material or air thus forming an air gap.

According to embodiments of the second inventive aspect, providing a vertical opening comprises providing a trench or a pillar through the stack of horizontal layers.

According to embodiments of the second inventive aspect, providing the vertical TMO ferroelectric layer comprises providing a uniform doped Hf-based ferroelectric layer. The Hf-based vertical ferroelectric layer is preferably doped with any of Al, Si, Y, Sr, La, Gd, Zr, or a combination thereof.

According to embodiments of the second inventive aspect, providing the vertical highly doped junction-less channel layer comprises providing doped silicon having a dopant concentration higher than 1e18 dopants/cm$^3$ in the vertical opening.

According to embodiments of the second inventive aspect, the horizontal gate electrode layer comprises a metal chosen from any of Cu, Al, Ti, W, Ni, Au, TiN, TaN, TaC, NbN, RuTa, Co, Ta, Mo, Pd, Pt, Ru, Ir and Ag or a combination thereof.

According to a third aspect of the present disclosure, a method for reading a memory cell of the vertical ferroelectric memory device according to embodiments of the first inventive aspect is disclosed, the method comprising applying 0V to all gate electrode layers in the memory device, except to the gate electrode of the memory cell to be read; applying a negative voltage to the gate electrode of the memory cell to be read, and measuring the current flowing through the vertical channel layer, whereby the current is high or low dependent on the polarization state of the vertical TMO ferroelectric layer in between the gate electrode of the memory cell to be read and the vertical channel layer.

It is an advantage that a memory device according to the present disclosure has high scalability. A memory device according to the present disclosure fits in several architectures such as Bit-Cost Scalable (BICS) NAND (Gate-all-Around or Macaroni-like), Terabit Cell Area Transistor (TCAT). A memory device according to the present disclosure also fits in a trench architecture, which gives it the same density as Flash 3D NAND memories with the same number of layers for the same critical dimension (CD). A trench architecture has the advantage that a vertical channel without curvature may be used. Unlike some prior art memory devices such as silicon-oxide-nitride-oxide-nitride (SONOS) memory devices, the curvature of the channel is not required to get good programming-erase operation for the vertical ferroelectric memory device according to the present disclosure. Whereas for prior art SONOS memory devices a GAA (pillar or macaroni-like) approach is needed, for a vertical ferroelectric memory device according to the present disclosure a trench-like architecture is possible with our without a trench filler. This has the advantage of obtaining a memory device with higher density. Prior art flash memory devices are two times less dense for the same CD than the vertical ferroelectric memory device according to the present disclosure, unless the Flash NAND memory would be able to operate in multilevel mode.

It is an advantage of a vertical ferroelectric memory device according to the present disclosure that by using a ferroelectric material, the voltage drop over the interfacial layer between the ferroelectric layer and the channel layer is reduced and the efficiency of the applied voltage is increased.

It is an advantage of a vertical ferroelectric memory device according to the present disclosure that it has a high vertical scalability (in function of the amount of stacked memory layers N) and a small periphery. By using a multilayer cell approach for a gate-all-around (GAA) approach 1 bit per layer per gate can be stored. By using a multilayer cell approach for a trench approach 2 bits per layer per trench can be stored. A vertical ferroelectric memory device according to the present disclosure can thus store N bits per cell string for a trench-like architecture or even 2N bits per cell string which effectively doubles the storage density, with a minimum overhead in technology.

It is an advantage of a vertical ferroelectric memory device according to the present disclosure that few or no depleted regions are present in the device at 0V (junction-less) in read mode.

It is an advantage that a vertical ferroelectric memory device according to the present disclosure has a low equivalent oxide thickness (EOT) which gives more read current.

It is an advantage that a vertical ferroelectric memory device according to the present disclosure has a low sensitivity to tapering. Since the concept doesn't rely on curvature the high aspect ratio etch is largely relaxed.

It is an advantage that a vertical ferroelectric memory device according to the present disclosure can be operated at low voltages, i.e. less than 10V, and preferably less than 5V, which saves on area and on power.

It is an advantage that a vertical ferroelectric memory device according to the present disclosure has a better endurance compared to prior art memory devices such as 3D Flash NAND due to the less invasive programming mechanism of such memory device in comparison to the electron tunnelling at high electric field for prior art 3D flash NAND.

It is an advantage of a method for manufacturing a vertical ferroelectric memory device according to the present disclosure that such method is fabrication friendly. The use of a ferroelectric material with relative low k-values, low in comparison with commonly used ferroelectric materials such a strontium bismuth tantalate (SBT) or lead zirconium titanate (PZT), which have a very high k value (around 250 or higher), allows depositing thereof using a fab friendly, highly conformal deposition process.

It is an advantage of a vertical ferroelectric memory device according to the present disclosure that the depolarization field in the memory device is reduced, which thus leads to higher retention times of the memory device.

It is an advantage of a vertical ferroelectric memory device according to the present disclosure that the device is simpler to fabricate and fabrication costs are reduced.

It is an advantage that a vertical ferroelectric memory device according to embodiments of the present disclosure can have a more uniform current flow through the vertical ferroelectric memory device when comprising a dielectric filler material.

It is an advantage for such a vertical ferroelectric memory device where a dielectric filler material is used, that the current modulation may be enhanced to bring the vertical ferroelectric memory device in depletion mode.

It is an advantage for such a vertical ferroelectric memory device that by using a dielectric filler material in the vertical ferroelectric memory device, the channel layer is made smaller Due to the narrower channel, it is possible to increase the doping concentration in the channel layer while maintaining the ability to turn off the channel by gate control i.e. applying a voltage to the gate.

It is an advantage that a vertical ferroelectric memory device according to embodiments of the present disclosure when comprising a metal gate electrode layer, the gate electrode has a lower electrical resistance as compared to e.g. a polysilicon gate electrode. Moreover, metals offer near to zero electrical resistance which polysilicon does not. Hence, a vertical ferroelectric memory device comprising metal gate electrode layers is advantageous for charging and discharging the gate capacitance of the memory cell such that a faster device is provided.

Further features of, and advantages with, the present disclosure will become apparent when studying the appended claims and the following description. The skilled person will realize that different features of the present disclosure may be combined to create embodiments other than those described in the following, without departing from the scope of the present disclosure.

BRIEF DESCRIPTION OF THE DRAWINGS

This and other aspects of the present disclosure will now be described in more detail, with reference to the enclosed drawings showing embodiments of the disclosure.

FIG. 1 shows the cross-section through A-A' of FIG. 2.

FIG. 1 shows the cross-section through A-A' of FIG. 3.

FIG. 4 shows the cross-section through A-A' of FIG. 5.

FIG. 4 shows the cross-section through A-A' of FIG. 6.

DETAILED DESCRIPTION OF CERTAIN ILLUSTRATIVE EMBODIMENTS

Figure 1:
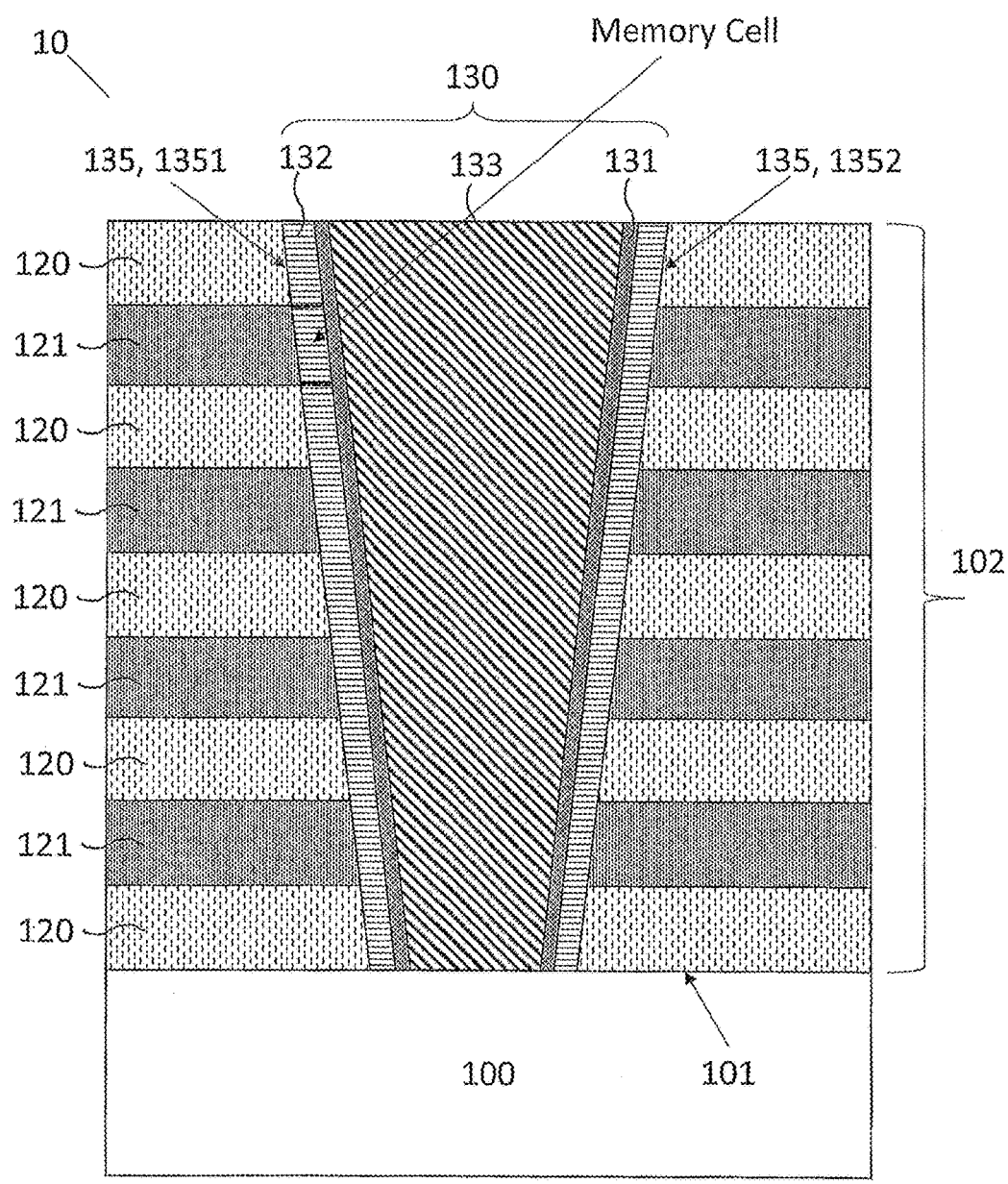
FIG. 1 illustrates a cross-sectional side view of a vertical three dimensional ferroelectric memory device according to different embodiments of the present disclosure.

The present disclosure will now be described more fully hereinafter with reference to the accompanying drawings, in which currently preferred embodiments of the disclosure are shown. This disclosure may, however, be embodied in many different forms and should not be construed as limited to the embodiments set forth herein. These embodiments are rather provided for thoroughness and completeness, and for fully conveying the scope of the disclosure to the skilled person.

It will be understood that the terms vertical and horizontal are used herein refer to particular orientations of the figures perpendicular to one another and these terms are not limitations to the specific embodiments described herein.

The terms first, second and the like in the description are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein. The terms so used are interchangeable under appropriate circumstances and the embodiments of the disclosure described herein can operate in other orientations than described or illustrated herein.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Also two or more steps may be performed concurrently or with partial concurrence. Further, the steps of the method may be performed in an order different from what has been disclosed. Such variation will depend on the process hardware systems chosen and on designer choice. All such variations are within the scope of the disclosure. Additionally, even though the disclosure has been described with reference to specific exemplifying embodiments thereof, many different alterations, modifications and the like will become apparent for those skilled in the art.

As described herein, a junction-less device has no physical semiconductor-semiconductor junction within the active device area (excluding the contacting area). In the context of a vertical three-dimensional semiconductor device, a junction-less device has no physical semiconductor-semiconductor junction along the vertical channel layer 133. In some embodiments, the vertical channel layer 133 has no semiconductor hetero-junction, such as a PN junction (e.g., a heterojunction formed between any one of $P^+$, P or $P^-$ regions and any one of $N^+$, N or $N^-$ regions). In some other embodiments, the vertical channel layer 133 has no semiconductor homo-junction, such as a $P^+P$ junction, a $P^+P^-$ junction, a PT junction, an $N^+$, N junction, an $N^+N$-junction, or an $N^-N$ junction. As used herein, when the dopant concentration is of order of one dopant atom per 100 million atoms, the doping level is referred to as being low or light (e.g., $N^-$ or $P^-$), as the term is conventionally used in the industry. When more dopant atoms are added, on the order of one per ten thousand atoms, the doping level is referred to as being heavy or high (e.g., $N^+$ or $P^+$), as the term is conventionally used in the industry. A doping level between heavy and light doping concentrations is denoted without a +or a − sign, as the notation is conventionally used in the industry. Thus, the doping profile along the channel portion 133 is substantially uniform. The junction-less device may therefore be understood as a resistor in which the mobile carrier density may be modulated by the gate electrode layers 121. A junction-less device can be implemented by a nanostructure, e.g. a nanowire, where source, drain and channel are uniformly doped, rather than the channel being delimited from source and drain, respectively, by means of abrupt junctions as is known in the art. As source, drain and channel are uniformly doped, source and drain cannot be distinguished from the channel, and therefore in the context of the present disclosure are not called as such. Source, drain and channel region have thus the same doping type an doping concentration along the vertical channel layer. Unless explicitly mentioned, when reference is made to 'the channel region' or 'channel layer' this also includes source and drain regions. The majority carriers in the source, drain and channel region will thus be the same when applying 0V to the gate electrodes. The vertical ferroelectric memory device according to the present disclosure is thus a junction-less device, which is advantageous in that few or no depleted regions are present in the memory device. A memory device may be made smaller resulting in a higher cell density. Further, the vertical ferroelectric memory device 10 may become simpler to fabricate and the fabrication costs reduced. Furthermore, the use of junction-less vertical FeFETs provides advantages when using memory cells according to embodiments of the present disclosure in 3D stacked memory structures.

It should be noted that within the context of this application the term "sidewall surface" may be any surface of the vertical channel structure that crosses, is perpendicular to or substantially perpendicular to a major surface of the substrate.

The vertical ferroelectric memory device 10 comprises a stack of alternating horizontal layers on a major surface 101 of a substrate 100, the stack of layers 102 comprising a repetition of an insulating layer 120 on a gate electrode layer 121.

The substrate 100 is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate 100 may include for example, an insulating layer such as a $SiO_2$ or a $Si_3N_4$ layer in addition to a semiconductor substrate portion. Thus, the term substrate 100 also includes silicon-on-glass, silicon-on-sapphire substrates. Also, the substrate 100 may be any other base on which a layer is formed, for example a glass or metal layer. Accordingly, a substrate 100 may be a wafer such as a blanket wafer or may be a layer applied to another base material, e.g. an epitaxial layer grown onto a lower layer.

The substrate 100 has a major surface or top surface 101.

Figure 7:
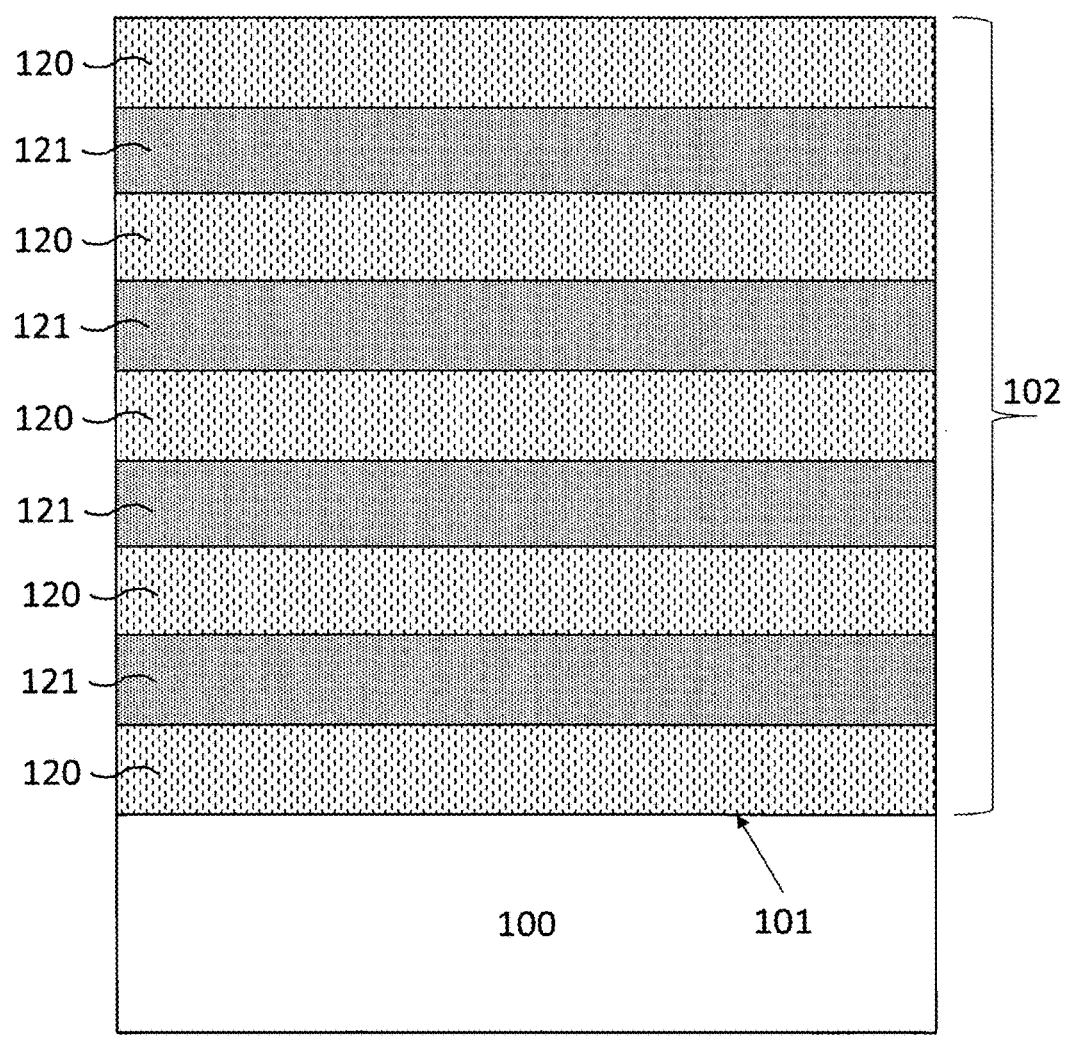
FIGS. 7 to 10 illustrate different process steps for manufacturing a vertical three dimensional ferroelectric memory device according to different embodiments of the disclosure.

On the major surface 101 of the substrate 100 a stack 102 of alternating horizontal layers 120, 121 is provided (FIG. 7). The stack 102 of alternating horizontal layers 120, 121 starts from the major surface 101 of the substrate 100 with an insulating layer 120 on the major surface and on the insulating layer a gate electrode layer 121. The stack 102 of horizontal layers 120, 121 comprises thus a repetition of a gate electrode layer 121 on an insulating layer 120.

The insulating layer 120 is an isolation layer between two subsequent gate electrode layers 121. The insulating layer 120 may comprise a dielectric material suitable for electrically isolating adjacent electrode layers 121, such as $SiO_x$ (e.g., $SiO_2$), $SiN_x$ (e.g., $Si_3N_4$), $SiO_xN_y$, $Al_2O_3$, AN, MgO and carbides or a combination thereof, to name a few. The insulating layer 120 may also comprise low-k dielectric materials such as for example carbon doped silicon oxide, porous silicon oxide, or might be comprising an air or vacuum (airgap) region.

The gate electrode layer 121 is a conductive layer and may comprise any conductive material such as for example polysilicon or a metal.

The metal for the gate electrode layer 121 may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

A metal gate electrode layer 121 can be advantageous over a similar structure formed of a semiconductor material, as metals generally have a lower electrical resistivity compared to many doped semiconductor materials, e.g., doped polysilicon. Moreover, metals offer the low electrical resistivity compared to polysilicon doped to practical levels without a need for high temperature dopant activation. Hence, gate electrode layers 121 comprising metal are advantageous for charging and discharging the gate capacitance of the memory cell such that a faster device 10 is provided. The use of a metal for forming the gate electrode layer 121 further removes the carrier depletion effect commonly observed in for example polysilicon. The carrier depletion effect is also referred to as the poly depletion effect. The reduction of poly depletion effect in the gate electrode layers 121 can be advantageous for improving data retention. Without being bound to any theory, the presence of poly depletion effect can introduce undesirable built-in electrical fields, which can in turn give rise to an undesirable depolarization field in the ferroelectric layer 132 when no external electric field is applied to the gate electrode layers 121.

In addition to reducing the depolarization field arising from the gate layer, it is also desirable to reduce the depolarization field that can arise from depletion effects in the channel layer. The first (reduction of depletion in the channel) may be accomplished with a vertical ferroelectric memory device of the present disclosure by a highly doped channel layer. As discussed above, the latter (reduction of depletion in the gate layer) may be accomplished with a vertical ferroelectric memory device of the present disclosure by using a metal gate.

The stack 102 of alternating horizontal layers 120, 121 may be formed using suitable deposition techniques, for example, atomic layer deposition (ALD), physical vapor deposition (PVD), chemical vapor phase deposition (CVD), more preferably, low pressure CVD (LPCVD) or alternatively plasma enhanced CVD (PECVD).

The metal comprising layers described may be deposited in a number of ways, for instance: metal-evaporation, sputtering, chemical vapor deposition (CVD), atomic layer deposition (ALD).

Figure 2:
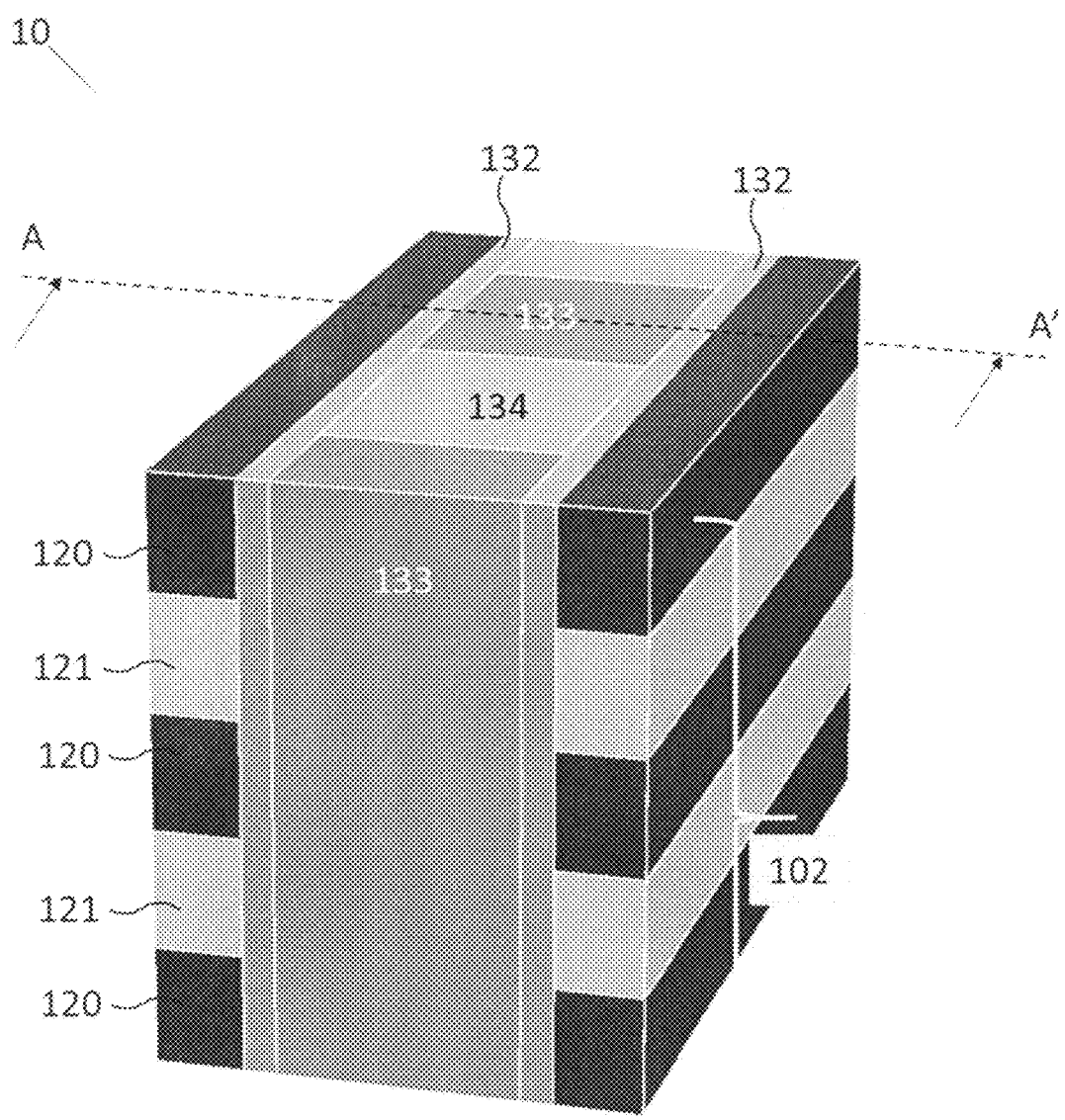
FIG. 2 illustrates a three dimensional front view of a vertical three dimensional ferroelectric memory device comprising a trench-like vertical structure according to certain embodiments of the present disclosure.
Figure 3:
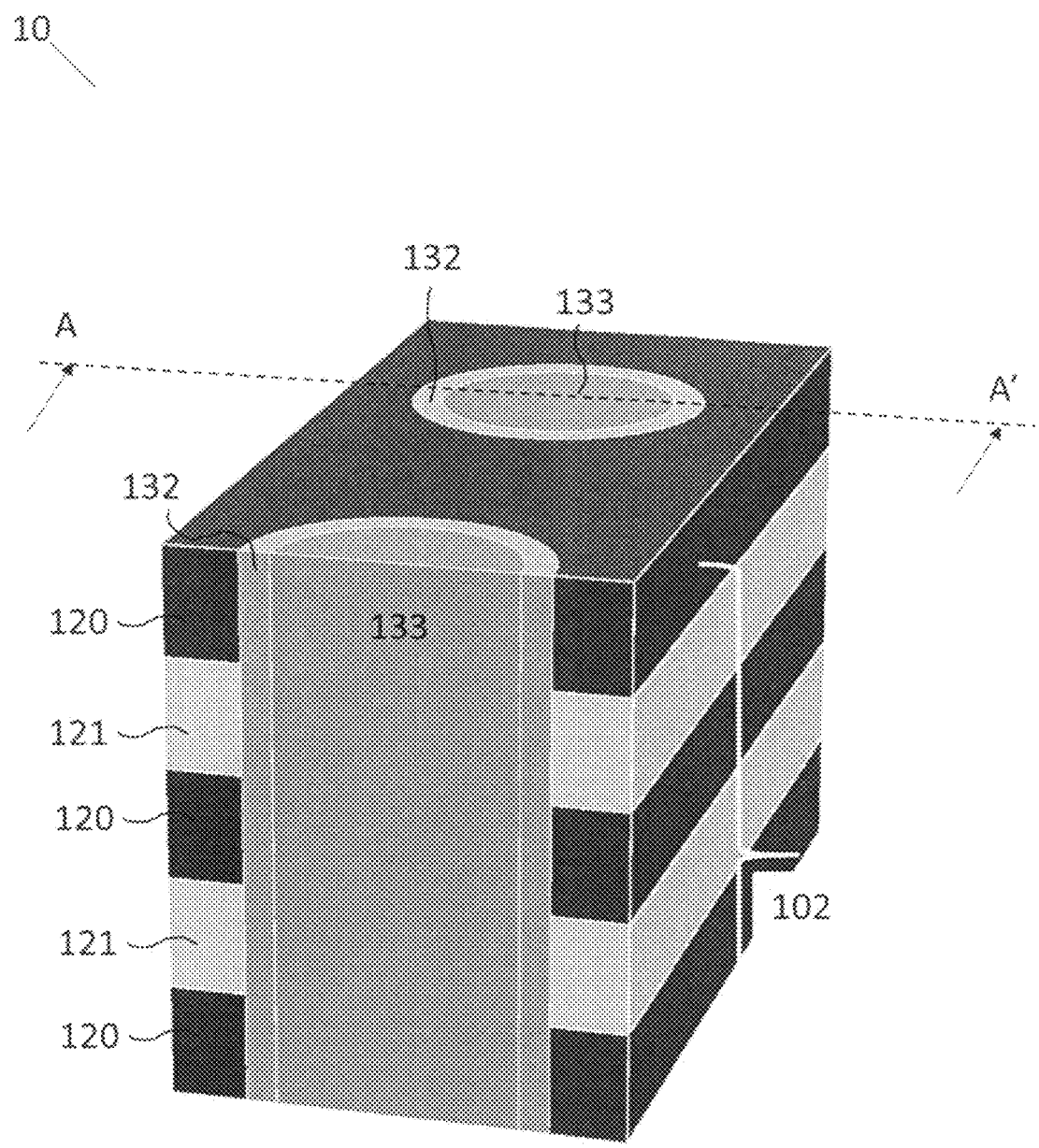
FIG. 3 illustrates a three dimensional front view of a vertical three dimensional ferroelectric memory device comprising a pillar-like (GAA) vertical structure according to certain embodiments of the present disclosure.
Figure 4:
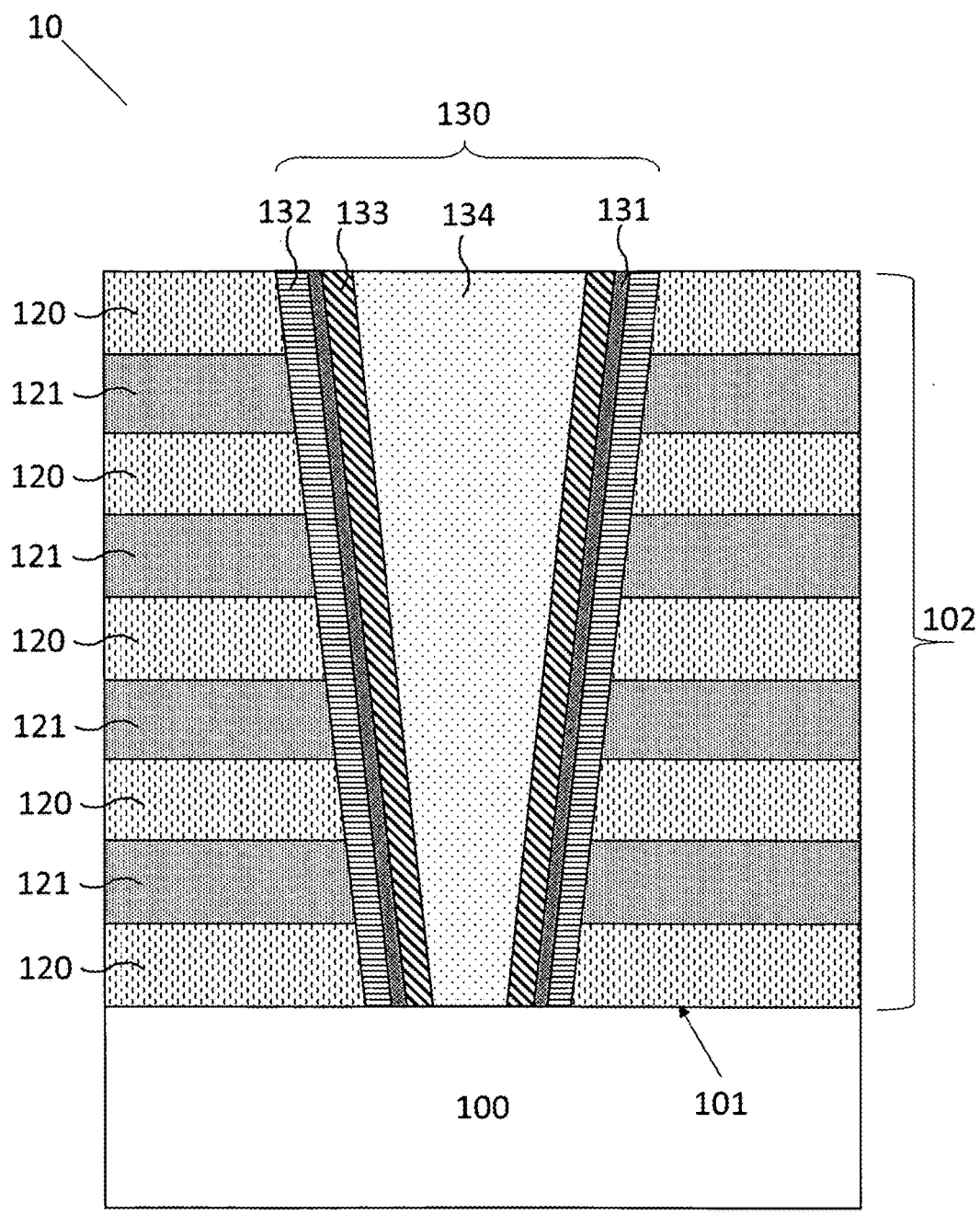
FIG. 4 illustrates a cross-sectional side view of a vertical three dimensional ferroelectric memory device comprising a dielectric filler according to different embodiments of the present disclosure.
Figure 5:
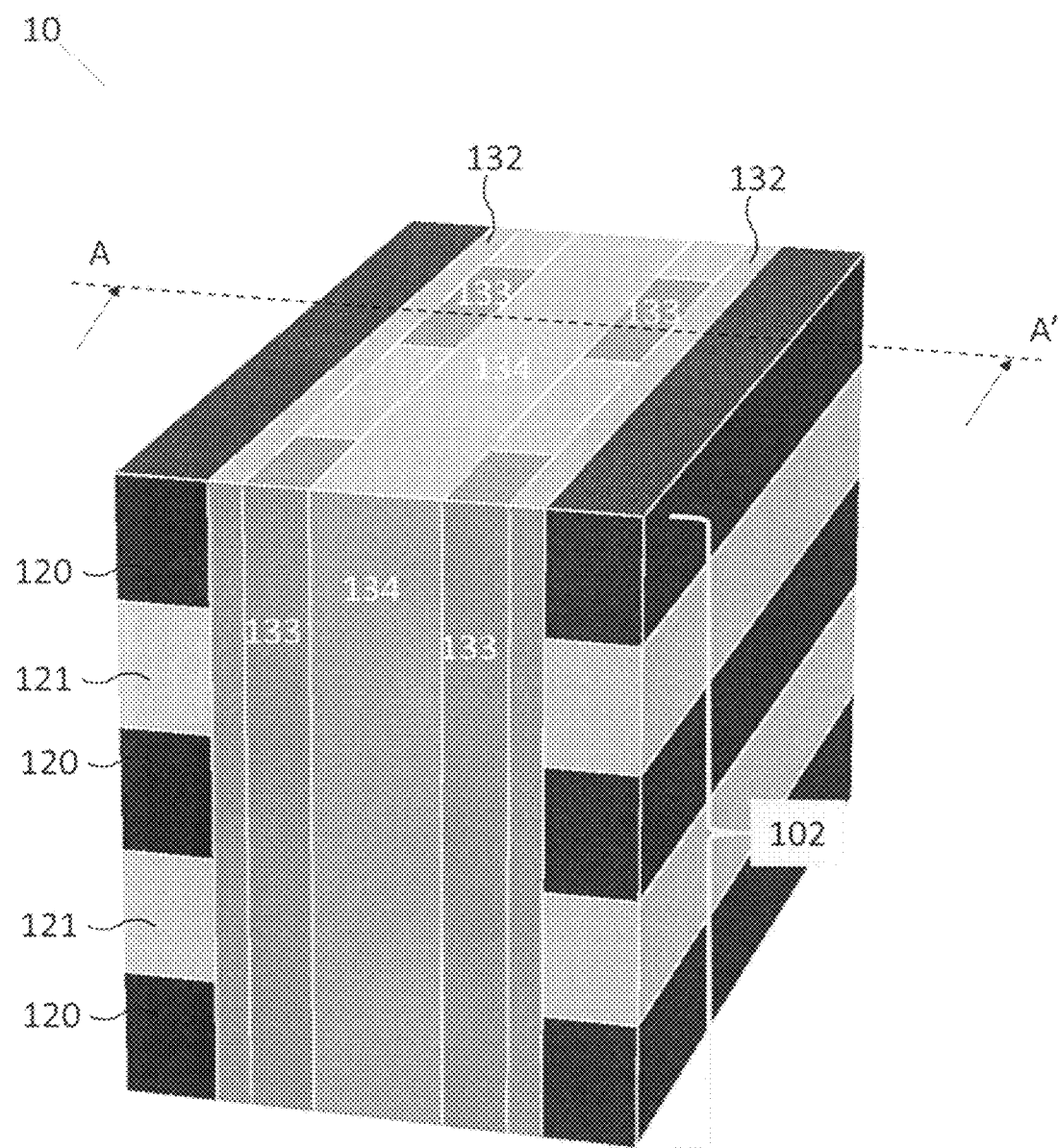
FIG. 5 illustrates a three dimensional front view of a vertical three dimensional ferroelectric memory device comprising a trench-like vertical structure according to certain embodiments of the present disclosure.
Figure 6:
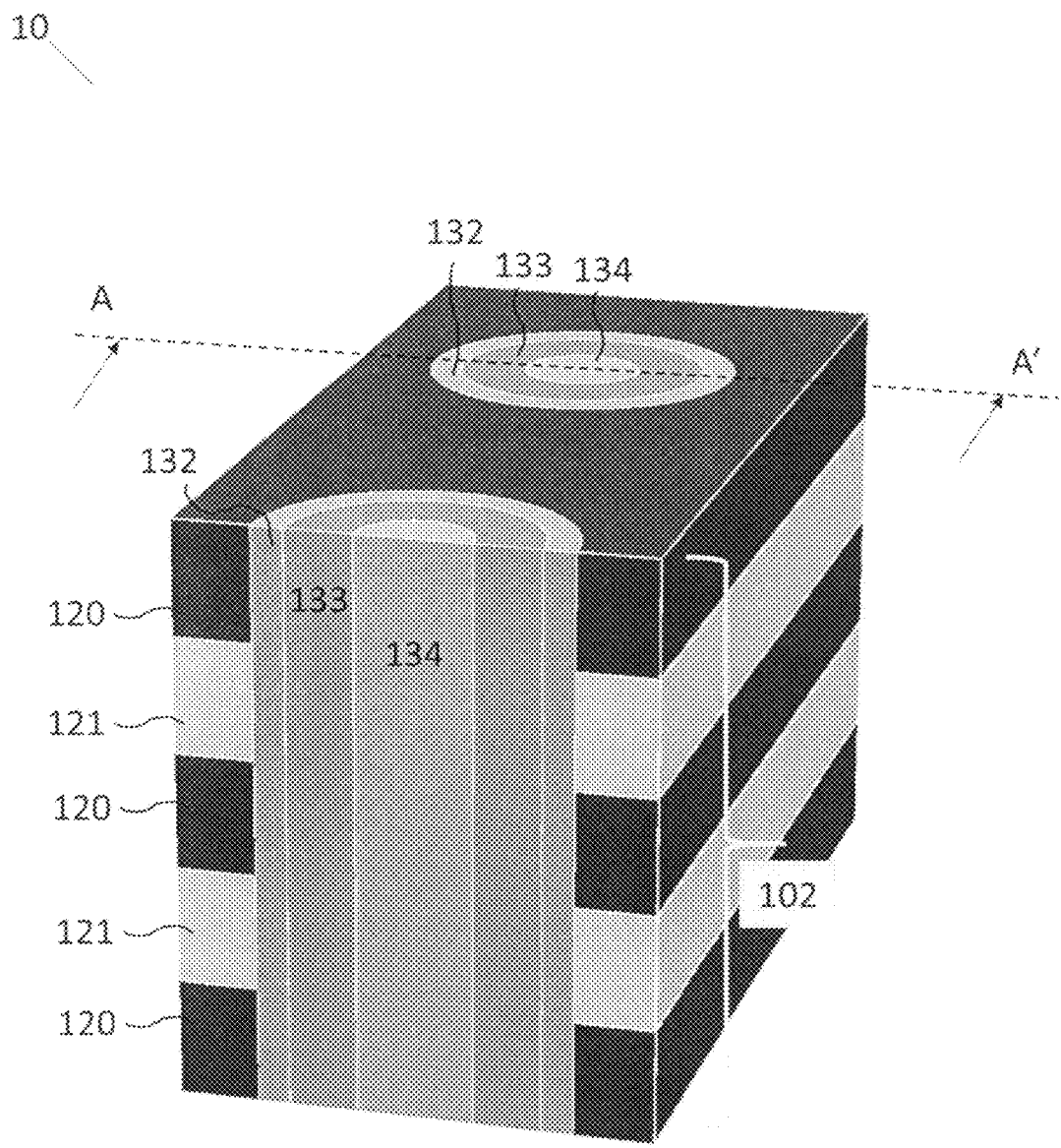
FIG. 6 illustrates a three dimensional front view of a vertical three dimensional ferroelectric memory device comprising a pillar-like (GAA) vertical structure according to certain embodiments of the present disclosure.

Through the stack 102 of alternating horizontal layers 120, 121 a vertical structure 130 is present. The vertical structure is substantially perpendicular to the major surface 101 of the substrate 100 and is at least extending through part of the stack, more preferably throughout the complete stack 102 of alternating horizontal layers 120, 121. The vertical structure 130 has a sidewall 135 along the stack 102 of alternating horizontal layers 120, 121. Depending on the shape of the vertical structure 130, the sidewall 135 may have a different shape. When the vertical structure 130 is a trench (FIGS. 2, 5), the sidewall 135 has a rectangular shape, i.e. the vertical structure has a rectangular horizontal cross-section from top view. When the vertical structure 130 has a pillar (cylindrical) shape (FIGS. 3, 6), the sidewall 135 is cylindrical, i.e. the vertical structure has a circular cross-section from top view.

Figure 8:
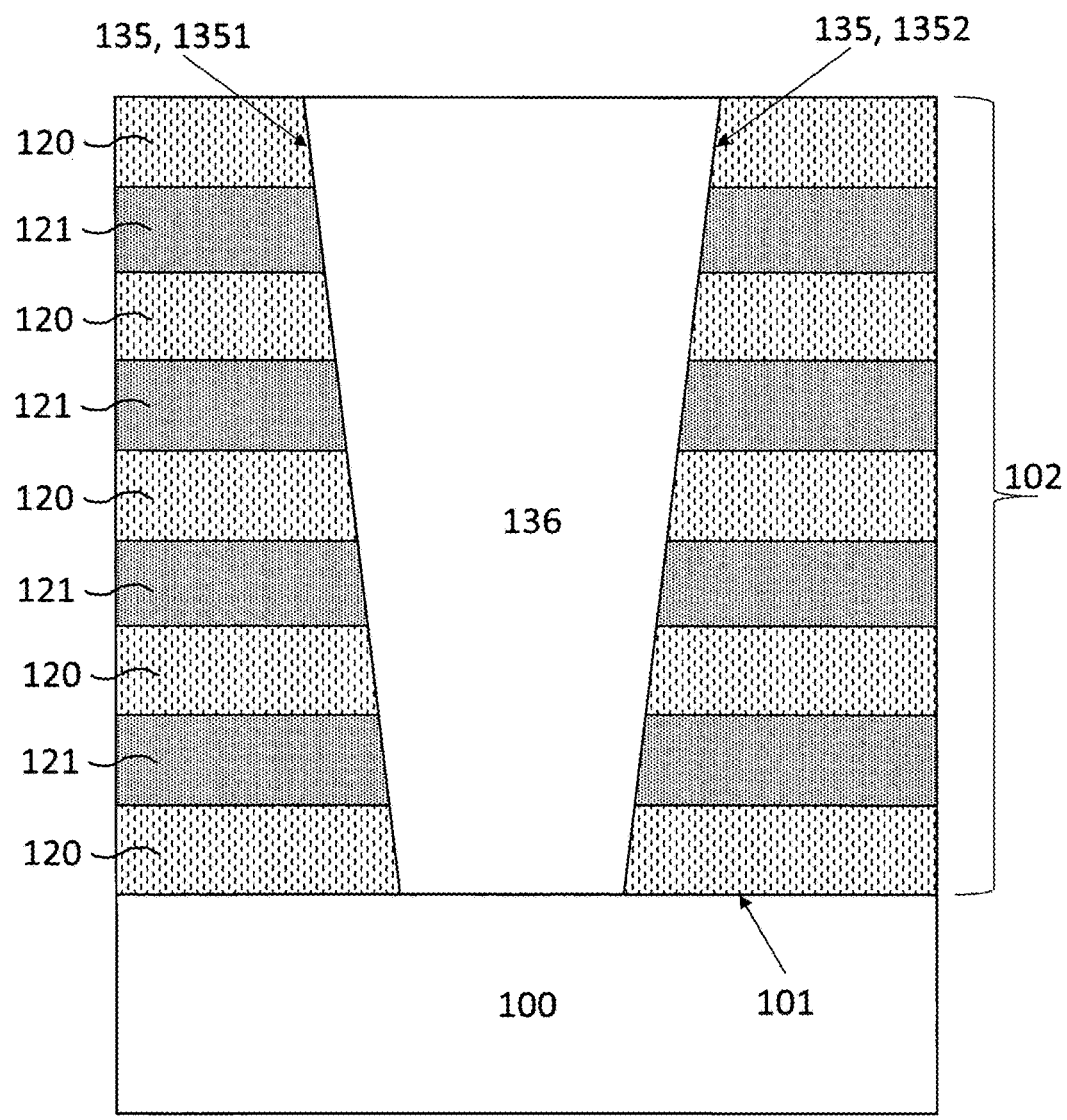
Figure 9:
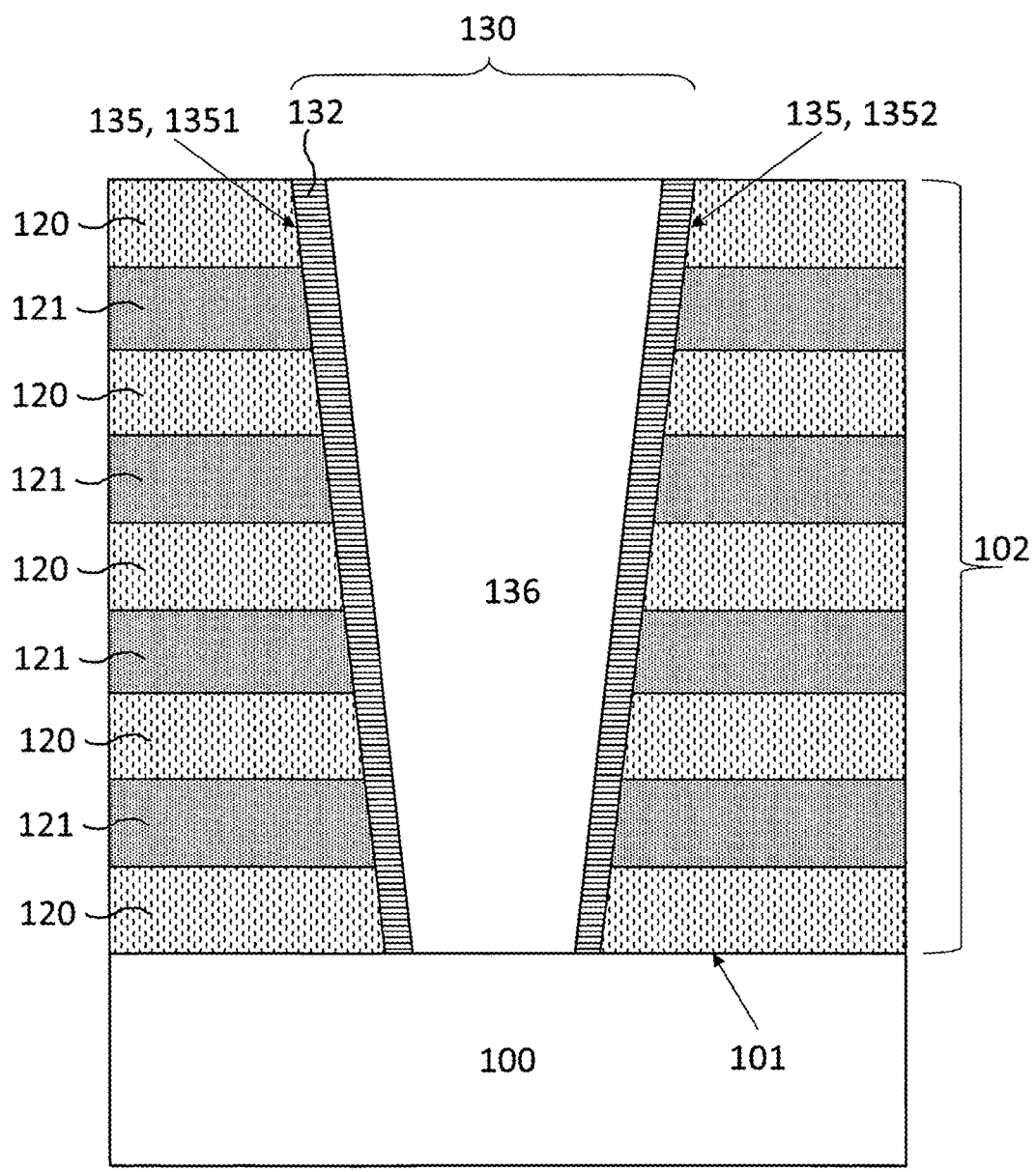

In order to fabricate the vertical channel structure 130, a vertical opening or hole 136 may be formed through the stack 102 of alternating horizontal layers 120, 121 (FIG. 8). The vertical opening may be a hole (or pillar or cylinder) or a trench extending through the stack of layers 102. The formation of the vertical opening may be achieved using suitable process techniques such as, for example, the punch process for providing a pillar-like vertical structure of for example patterning and etching for providing a trench-like vertical structure.

The width of the vertical opening (i.e. width of the trench or the diameter of the pillar) is depending on the technology node. The width of the vertical opening may be 120 nm or even smaller, such as 60 nm.

The difference between a trench-like vertical structure and a cylindrical vertical structure (also referred to as gate-all-around (GAA) vertical structure as the gate electrodes are wrapped around the channel region) lies in the amount of bits which can be stored. In case of the trench-like vertical structure (FIGS. 2, 5) 2 bits may be stored per layer per trench. For a trench at each side of the trench a bit can be stored, thus 1 bit at the left side wall and 1 bit at the right side wall. In case of the GAA vertical structure (FIGS. 3, 6) 1 bit may be stored per layer per gate.

After providing the vertical opening 136, the further layers to complete the memory device 10 may be provided such as the vertical ferroelectric layer, the vertical channel layer and, optional also the vertical interfacial layer and the filler material.

One of the features of the vertical ferroelectric memory device 10 according to different embodiments is a vertical transition metal oxide (TMO) based ferroelectric layer 132, which is present in the vertical opening, uniform and conformal along the sidewall 135 of the trench. The vertical TMO based ferroelectric layer 132 may be directly in contact with the sidewall 135 of the vertical opening, i.e., in direct contact with the gate electrode layers 121 and the insulating layers 120. A transition metal oxide (TMO) as described herein refers to an oxide of one or more transition metals, which includes elements within Groups 3 through 12 in the periodic table. In some embodiments, the vertical ferroelectric layer 132 comprises a single transition metal oxide such as hafnium oxide (e.g., $HfO_2$), aluminum oxide (e.g., $Al_2O_3$), zirconium oxide (e.g., $ZrO_2$), titanium oxide (e.g., $TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$) among other single transition metal oxides, to name a few. In other embodiments, the vertical ferroelectric layer 132 comprises a binary, a ternary, a quaternary or a higher transition metal oxide which includes two, three, four or more metals forming the transition metal oxide.

After providing the vertical opening 136, the vertical TMO ferroelectric layer 132 is provided along the sidewall 135 of the vertical opening 136. The vertical TMO ferroelectric layer 132 may be provided using suitable deposition techniques that allow a uniform and conformal deposition of the layer, such as, for example, atomic layer deposition (ALD).

The thickness of the vertical TMO ferroelectric layer 132 is preferably in the range of 5 nm to 20 nm. Moreover the thickness of the vertical TMO ferroelectric layer 132 may be tuned depending on the thickness of the vertical channel layer 133.

In retention, when 0V is applied to the gate electrodes, the equivalent oxide thickness of the EOT of the depletion width in the vertical channel layer 133, summed up with the (EOT) of the vertical interfacial layer 131 if present, is desired to be smaller than the thickness of the vertical ferroelectric layer 132. This depletion width depends on the particular engineering of the memory device: if the vertical channel layer 133 is in strong accumulation, for example by engineering the work function of the gate layer 121, the depletion width of this layer is defined by the quantum confinement at the semiconductor-dielectric interface (typically less than 1 nm). If the stack engineering is such that the vertical channel layer 133 is in flatband condition with 0V applied to the gate electrode, the depletion width is equal to the extrinsic Debye length in the channel layer. The extrinsic Debye length can be determined knowing the semiconductor material and the doping concentration in the vertical channel layer.

According to embodiments, the vertical TMO ferroelectric layer 132 is preferably doped. The vertical ferroelectric memory device 10 according to preferred embodiments comprises a $HfO_2$ ferroelectric layer which is doped with Si, Y, Gd, La, Zr or Al. The vertical TMO based ferroelectric layer may thus for example be $HfZrO_4$, $Y:HfO_2$, $Sr:HfO_2$, $La:HfO_2$, $Al:HfO_2$ or $Gd:HfO_2$.

It's an advantage of using a vertical TMO-based ferroelectric layer, optionally doped, that the layer may be easily formed conformal and uniform along the vertical opening using atomic layer deposition (ALD) techniques. This uniform deposition is difficult with conventional ferroelectric materials used in the prior art such as complex perovskites for example strontium bismuth tantalate (SBT) or lead zirconium titanate (PZT).

It's a further advantage of using a vertical TMO ferroelectric material, optionally doped, for the vertical ferroelectric layer of a memory device according to embodiments that a replacement gate (RMG) fabrication process may be utilized for manufacturing the memory device. In a RMG fabrication process the final gate electrodes may be provided after all the vertical layers (i.e. vertical ferroelectric layer, vertical channel layer, vertical interfacial layer and dielectric filler) are provided. The gate electrode layers of the stack of horizontal layers may thus initially be sacrificial layers which are replaced later in the process flow into the final gate electrode layers after providing all the vertical layers (i.e. vertical ferroelectric layer, vertical channel layer, vertical interfacial layer and dielectric filler).

The vertical TMO ferroelectric layer 132, optionally doped, should have a k-value (k=dielectric constant) lower than the k-value of conventional ferroelectric materials such as perovskites strontium bismuth tantalate (SBT) or lead zirconium titanate (PZT) ferroelectric materials. SBT and PZT typically have a very high-k value (around 250 or higher) such that a very large physical thickness (in order to get a sufficient EOT) would be needed for such material to be used as a ferroelectric layer in a memory device.

The vertical TMO ferroelectric layer 132, optionally doped, is uniform and conformal along the sidewall of the vertical structure, i.e. the trench or pillar. This means that the vertical TMO ferroelectric layer 132, optionally doped, is in contact with or overlaps all the horizontal gate electrode layers 121 and all the horizontal insulating layers 120. The vertical TMO ferroelectric layer 132, optionally doped, between the horizontal gate electrode layers 121 and the vertical channel layer 133 may have two possible polarization status. The vertical TMO ferroelectric layer 132, optionally doped, between the horizontal insulating layers 120 and the vertical channel layer 133 may have any polarization status, which might be the same as one of the two polarization statuses in the vertical TMO ferroelectric layer 132, optionally doped, between the horizontal gate electrode layers and the vertical channel layer 133. It may also be a different polarization status, corresponding to a different orientation of the ferroelectric polarization, or even a combination of different random orientations of the polarization. Although the polarization status in this region is not controlled, this will not influence the current through the vertical channel layer because the vertical channel layer is highly doped.

Figure 10:
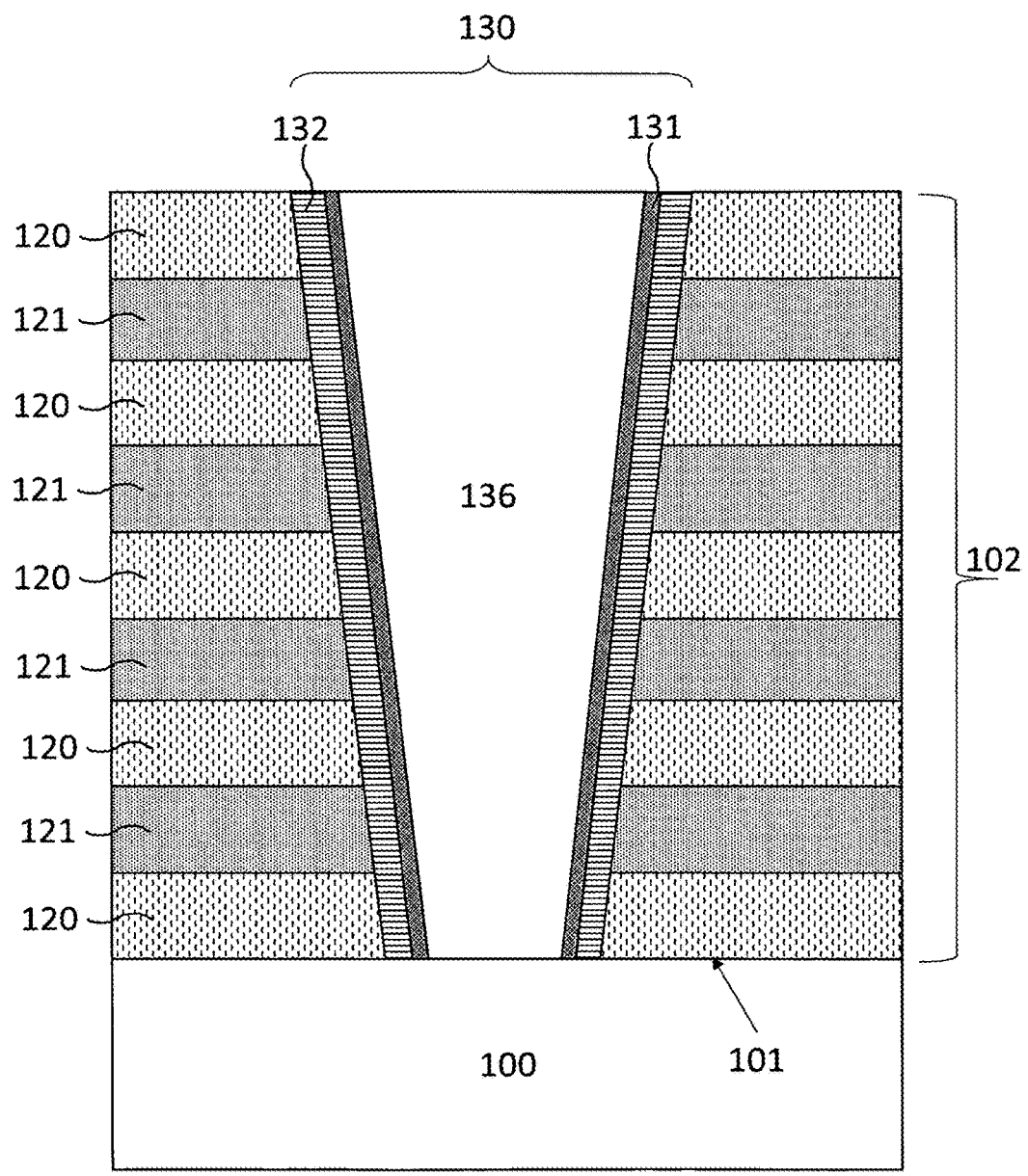

After providing the vertical ferroelectric layer 132, preferably a vertical insulating interfacial layer 131 is provided first on the vertical TMO based ferroelectric layer 132 before providing the vertical channel layer 133 (FIG. 10). The vertical insulating interfacial layer 131 may comprise $SiO_2$ and then provides a good interface between the vertical channel layer 133 and the vertical ferroelectric layer 132. If present, the vertical interfacial layer 131 also improves the carrier mobility of the vertical channel layer 133 and thereby enables a faster operation of the memory device 10. The vertical insulating interfacial layer 131 may be provided using a suitable deposition technique that enables a uniform and conformal deposition along the vertical ferroelectric layer 132 in the opening 136.

The interfacial layer 131 between the vertical channel layer 133 and the vertical ferroelectric layer 132 is however not shown in the three dimensional front view FIGS. 2, 3, 5 and 6.

The vertical structure 130 further comprises a vertical highly doped junction-less channel layer 133 along the vertical TMO ferroelectric layer 132 or along the vertical interfacial insulating layer 131 when present. The vertical channel layer 133 may be provided using a suitable deposition technique which enables a uniform and conformal deposition along the vertical ferroelectric layer 132 or the vertical interfacial insulating layer 131, when present, in the opening 136, such as for example ALD. The vertical channel layer 133 may also be provided using a suitable deposition technique such as, for example, chemical vapour deposition (CVD), which enables the vertical channel material to be provided in the remaining part of the vertical opening 136.

The vertical channel layer 133 may thus be provided in the opening 136 completely filling the opening (FIGS. 1-3) or the vertical channel layer 133 may be provided such that after deposition there is an opening 136 left, which remaining opening may thereafter be filled with a dielectric filler material 134 (FIGS. 4-7). Otherwise said, after providing the vertical TMO ferroelectric layer 132, or after providing the vertical interfacial layer 131 when present, the core of the vertical opening may be completely filled by the vertical channel layer 133 or may be filled with a uniform (conformal) vertical channel layer 133 along the sidewall thereafter the remaining core of the vertical opening being filled with dielectric filler material 134.

The dielectric filler material may for example be chosen from $Al_2O_3$, $SiO_2$, SiN, air or vacuum (creating an airgap), and a low-k material, to name a few.

The vertical channel region or channel layer of the vertical ferroelectric memory device according to the present disclosure must be highly doped. This is necessary to get a so-called pinch-off effect in the memory device. Different possible interpretations of 'highly doped' will now be elaborated.

When 0V is applied to the gate electrode layers, independent of the polarization state of the vertical ferroelectric layer, the concentration of majority carriers in the channel region being responsible for the doping of the channel region should be much larger than the minority carriers. Much larger means at least $10^4$ times larger, or more than $10^4$ times larger when the channel region material is for example Si, Ge, GaAs or another semiconductor with bandgap larger than 0.6 eV. The difference in concentration between majority and minority carriers can however be smaller when the channel material is a narrow bandgap semiconductor such as InAs or InSb.

If the vertical channel region or channel layer is for example silicon doped with Ph or As, the majority carriers are electrons. The concentration of these majority carriers (electrons) should thus be at least $10^4$ times larger than the concentration of holes in the channel region. If the vertical channel region or channel layer is for example silicon doped with B, the majority carriers are holes. The concentration of these majority carriers (holes) should thus be at least $10^4$ times larger than the concentration of electrons in the channel region.

On the other hand, the doping concentration should also be not too high in order to allow that the channel still can be depleted by the gate control voltage in order to turn off the memory cell (which is at a negative voltage applied to the gate electrode layer for n-o$_p$e, and at positive voltage applied to the gate electrode for p-type). The doping concentration in the channel region is preferably in a range between $1.0 \times 10^{18}$ dopants/cm$^3$ and $1 \times 10^{20}$ dopants/cm$^3$, between $1.0 \times 10^{19}$ dopants/cm$^3$ and $1 \times 10^{20}$ dopants/cm$^3$, between $1.0 \times 10^{18}$ dopants/cm$^3$ and $2 \times 10^{19}$ dopants/cm$^3$, or between $1.0 \times 10^{19}$ dopants/cm$^3$ and $2 \times 10^{19}$ dopants/cm$^3$.

Furthermore, the combined effect of the doping concentration in the vertical channel region and engineering the gate layer should be such that the EOT of the effective depletion width of the vertical channel layer is lower than the EOT of the TMO ferroelectric layer. This can be obtained by choosing both such that the surface of the vertical channel region is in strong accumulation when 0V is applied on the gate.

Alternatively the doping concentration in the vertical channel region can be such that the ratio of the extrinsic Debye length to the relative permittivity of the channel material is smaller than the ratio of the thickness of the vertical ferroelectric layer to the relative permittivity of the ferroelectric layer. In this case, it is sufficient that the vertical channel region is near flatband condition when 0V is applied on the gate layer.

Summarized, the channel region 133 of a vertical ferroelectric memory device 10, according to different embodiments of the present disclosure, has the following features, according to embodiments:

Source, drain and channel region (not the contact region) are uniformly doped, such they have a same doping type and, preferably, a same doping concentration. A higher doping concentration in that part of the source and/or drain regions which serve as the contact regions of the device. The contact regions are far remote from the channel region. These contact regions are thus not taken into consideration for the channel region, and The channel region (including source and drain) is highly doped such that when a gate voltage of 0V is applied to the gate electrodes (i.e. the device is idle/at rest) the channel layer is not in depletion, but remains conductive.

Furthermore, the channel region has one or more of the following features, according to embodiments:

The channel region may be in accumulation when a gate voltage of 0V is applied to the gate electrodes (i.e. the device is idle/in rest) due to suitable work function of the gate electrodes, and/or.

The channel region may be sufficiently highly doped such that the ratio of the extrinsic Debye length to the relative permittivity of the channel material is smaller than the ratio of the thickness of the vertical ferroelectric layer to the relative permittivity of the ferroelectric layer.

The extrinsic Debye length is a criterion for the depletion of the device at flatband condition.

Figure 11:
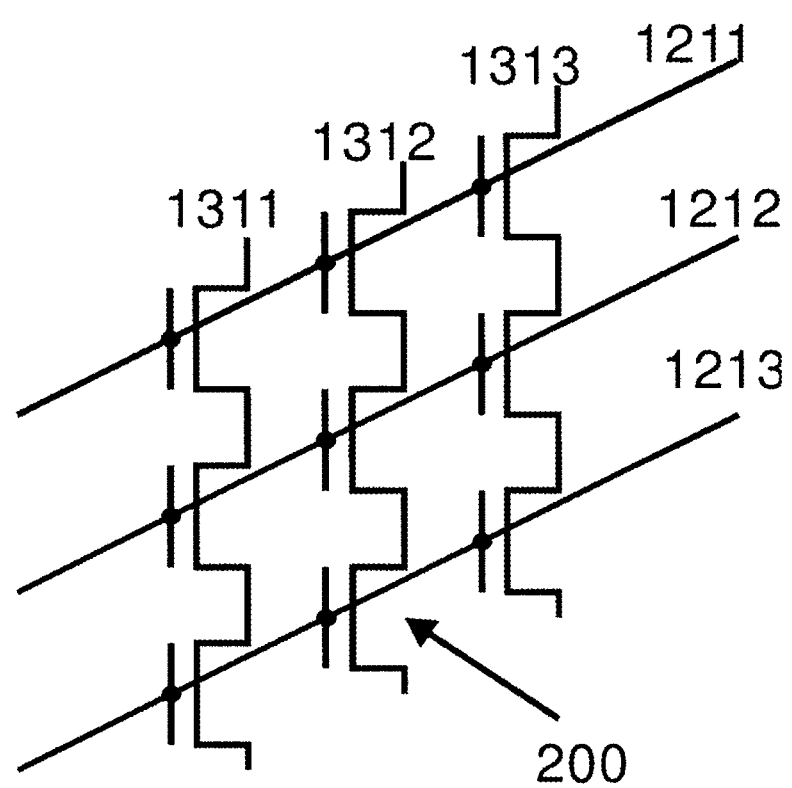
FIG. 11 illustrates a schematic representation of the NAND-array configuration comprising the vertical ferroelectric memory device according to the present disclosure.

FIG. 11 illustrates a schematic representation of a NAND-array configuration comprising a vertical ferroelectric memory device according to the present disclosure. The gate electrode layers 121 form the wordlines, 1211, 1212 and 1213 in this schematic. Although the schematic only represents 3 wordlines, the NAND-array preferentially has a high number of stacked wordlines (for example 32 or more wordlines) corresponding to the electrode layers 121 as shown in FIG. 10. Readout of the array can be done by measuring the current in one of the strings 1311, 1312, 1313.

A method for reading a memory cell of the vertical ferroelectric memory device comprises the steps of:
  applying 0V to all gate electrode layers in the memory device, except to the gate electrode of the memory cell to be read;
  applying a negative voltage to the gate electrode of the memory cell to be read, and;
  measuring the current flowing through the vertical channel layer, whereby the current is high or low dependent on the polarization state of the vertical TMO ferroelectric layer in between the gate electrode of the memory cell to be read and the vertical channel layer.

For example, in order to read out the memory cell 200 at the intersection of string 1312 and wordline 1213, reading this cell comprises the steps of:
  Applying 0V to the wordlines 1211 and 1212
  Applying a read voltage to the wordline 1213. If the vertical channel layer comprises/consists of highly N-type doped silicon, this read voltage is typically −1V although it can be different depending on the value of the silicon doping and on the properties of the vertical TMO ferroelectric layer.
  Measuring the current flowing through the string 1312. Depending on the polarization state of the vertical ferroelectric layer in between wordline 1213 and string 1312, the current through the string is high or low. The current range that corresponds to a high or a low current is chosen in order to have a sufficient difference in order to distinguish between the two currents with an external sense amplifier.

For example, the high current could be any current larger than 10 nA in which case the low current is any current below 1 nA. The high current could be chosen to be any current larger than 1 uA, with the low current being any current below 0.5 uA.

Figure 12A:
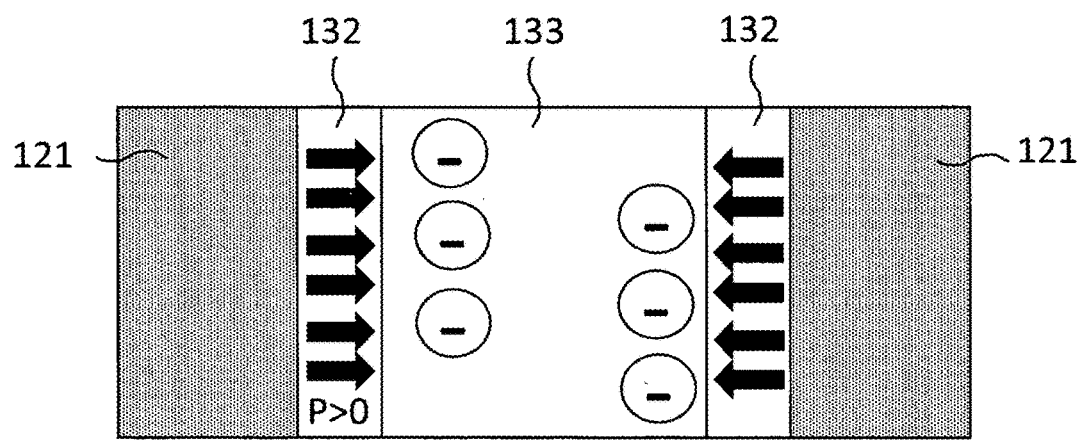
FIGS. 12A and 12B illustrate the working principle of a vertical ferroelectric memory device according to the present disclosure.
Figure 12B:
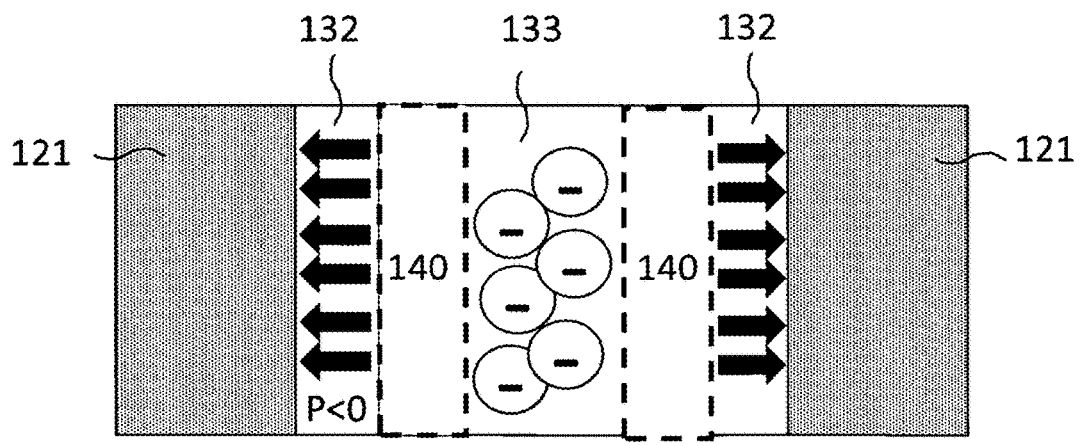

The working principle of the vertical FeFET memory device according to the present disclosure is based on the physics of ferroelectrics. When the vertical TMO ferroelectric layer 132 is depoled (i.e. polarization status P equals 0), the device is in a neutral condition, which corresponds to the thermal equilibrium condition of a similar device, but where the ferroelectric layer 132 is replaced by an ideal dielectric having the same thickness and permittivity. Assuming a vertical channel layer which is lowly n-type doped (electrons are majority carriers) will result in the formation of an accumulation region at the interface between the vertical TMO ferroelectric layer 132 and the vertical channel layer 133 for a positive polarization status (P>0) (FIG. 12A). On the other hand a depletion region 140 is formed at the interface between the vertical TMO ferroelectric layer 132 and the vertical channel layer 133 for a negative polarization status (P<0) (FIG. 12A). Due to the presence of this depletion layer, there will be a nonzero electrical field in the TMO ferroelectric layer 132, opposing the direction of ferroelectric polarization, and reducing the data retention of the memory device. Therefore this electric field is called the depolarization field.

By using the vertical FeFET memory device according the present disclosure, it is possible to strongly limit the depolarization field while maintaining the readout capability of the memory device.

By using a highly doped channel, either the negative polarisation status is not sufficient to move the channel from accumulation to depletion, or the channel doping is sufficient in order to limit the depth of the depletion layer (which is given by the extrinsic Debye length at flatband condition) so that its EOT is lower than the EOT of the vertical TMO ferroelectric layer when 0V is applied to the gate 121

By applying a negative read voltage on the gate 121, the channel region 133 can progressively be depleted. In this case, the polarization status P influences how strong a negative voltage has to be applied on the gate 121 in order to mostly or fully deplete the channel, leading to a low current through the channel. It is therefore possible to select a negative gate voltage which is sufficiently high in absolute value to deplete the channel when the TMO ferroelectric layer has a negative polarization status, but which is not sufficiently high in absolute value to deplete the channel when the TMO ferroelectric layer has a positive polarization status. This gate voltage can be defined as the selected wordline read voltage.

Therefore, by applying 0V on the nonselected wordlines and applying the selected wordline read voltage on a single wordline, the channel 133 next to the nonselected wordlines or dielectrics 120 is always in accumulation, and the channel next to the selected wordline can either be fully depleted or partially depleted during the read operation, depending on the polarization status of the vertical TMO ferroelectric layer. Therefore, only the polarization status of the TMO ferroelectric layer next to the selected wordline determines whether the channel current is high or low, and individual memory cells can be read out.

The selected wordline read voltage should be lower than the programming voltage. The programming voltage is applied in order to define the polarization state of the vertical ferroelectric layer at each of the gate electrode layers (=worldlines). The programming voltage may be typical around 4V-5V.

The memory device according to the present disclosure may be used for application such as mass storage memory chips for Solid State Drive and consumer applications or Storage Class Memory thereby bridging the gap between DRAM and Flash NAND in enterprise storage systems.

The foregoing is illustrative of example embodiments and is not to be construed as limiting thereof Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical ferroelectric memory device, comprising:
   a stack of horizontal layers formed on a semiconductor substrate, the stack of horizontal layers comprising a plurality of gate electrode layers alternating with a plurality of insulating layers; and
   a vertical structure comprising a vertical channel structure and a sidewall having formed thereon a vertical transition metal oxide (TMO) ferroelectric layer, wherein each of the vertical channel structure and the vertical TMO ferroelectric layer extends vertically through the stack of horizontal layers, wherein the vertical channel structure does not have a junction formed by oppositely doped semiconductor regions,
   wherein the vertical channel structure comprises a source, a channel and a drain that are highly doped with the same dopant type such that when no voltage is applied to the gate electrode layers, the vertical channel structure is in electrically conductive accumulation and not in depletion.

2. The vertical ferroelectric memory device of claim 1, wherein portions of the vertical TMO ferroelectric layer formed on the sidewall are interposed between the gate electrode layers and the vertical channel structure.

3. The vertical ferroelectric memory device according to claim 1, wherein the gate electrodes are formed of a metal.

4. The vertical ferroelectric memory device according to claim 3, wherein the gate electrodes are formed of a metal selected from the group consisting of Cu, Al, Ti, W, Ni, Au, TIN, TaN, TaC, NbN, RuTa, Co, Ta, Mo, Pd, Pt, Ru, Ir, Ag and combinations thereof.

5. The vertical ferroelectric memory device according to claim 1, wherein a dopant concentration in the vertical channel structure exceeds $1\times10^{18}$ atoms/cm$^3$.

6. The vertical ferroelectric memory device according to claim 1, wherein the vertical structure has a trench shape or has a pillar shape.

7. The vertical ferroelectric memory device according to claim 1, wherein a ratio of an extrinsic Debye length to a relative permittivity of the vertical channel structure is smaller than a ratio of a thickness of the vertical TMO ferroelectric layer to a relative permittivity of the vertical TMO ferroelectric layer.

8. The vertical ferroelectric memory device of claim 1, wherein the vertical structure further comprises a vertical interfacial insulating layer interposed between the vertical channel structure and the vertical TMO ferroelectric layer.

9. The vertical ferroelectric memory device of claim 1, wherein the vertical channel structure is laterally interposed between dielectric filler material regions.

10. A vertical ferroelectric memory device, comprising:
    a stack of horizontal layers formed on a semiconductor substrate, the stack of horizontal layers comprising a plurality gate electrode layers alternating with a plurality of insulating layers; and
    a vertical structure extending vertically through the stack of horizontal layers, the vertical structure comprising a vertical channel structure and a sidewall having formed thereon a vertical transition metal oxide (TMO) ferroelectric layer,
    wherein the vertical TMO ferroelectric layer is formed of a ferroelectric layer that is uniformly doped with a dopant, and
    wherein a memory cell is formed at each of overlapping regions between the gate electrode layers and the vertical channel structure, and
    wherein the vertical channel structure comprises a source, a channel and a drain that are highly doped with the same dopant type such that when no voltage is applied to the gate electrode layers, the vertical channel structure is in electrically conductive accumulation and not in depletion.

11. The vertical ferroelectric memory device according to claim 10, wherein the vertical TMO ferroelectric layer is formed of HfO$_2$ doped with the dopant selected from the group consisting of Al, Si, Y, Sr, La, Gd, Zr, and combinations thereof.

12. The vertical ferroelectric memory device of claim 1, wherein the vertical structure further comprises a dielectric filler material formed on an opposite side of the vertical channel structure as the vertical TMO ferroelectric layer, the dielectric filler material contacting the vertical channel structure and extending vertically through the stack of horizontal layers.

* * * * *

UNITED STATES PATENT AND TRADEMARK OFFICE
CERTIFICATE OF CORRECTION

PATENT NO. : 10,211,223 B2
APPLICATION NO. : 14/998227
DATED : February 19, 2019
INVENTOR(S) : Jan Van Houdt et al.

It is certified that error appears in the above-identified patent and that said Letters Patent is hereby corrected as shown below:

On the Title Page

Item (65), Line 3, under Prior Publication Data, below "Jun. 23, 2016" insert --Foreign Priority Information Dec. 23, 2014 (EP) 14199937--, as a new item entry.

In the Specification

In Column 1, Line 58, change "integarated" to --integrated--.

In Column 6, Line 65, change "PT" to --P⁻P--.

In Column 6, Line 65, change "N⁺,N" to --N⁺N--.

In Column 7, Line 8, change "+or" to --+ or--.

In Column 8, Line 7, change "AN," to --AlN,--.

In Column 12, Line 33, change "n-o$_p$e," to --n-type,--.

In Column 13, Line 2, change "to-" to --to--.

In Column 14, Line 30, change "121" to --121.--.

In the Claims

In Column 15, Line 43, Claim 4, change "TIN," to --TiN,--.

In Column 16, Line 34 (Approx.), Claim 10, change "lavers," to --layers,--.

Signed and Sealed this
Eleventh Day of June, 2019

Andrei Iancu
*Director of the United States Patent and Trademark Office*